(12) United States Patent
Model

(10) Patent No.: US 8,193,864 B2
(45) Date of Patent: Jun. 5, 2012

(54) HIGH EFFICIENCY POWER AMPLIFIER POWER ARCHITECTURE

(75) Inventor: Michael J. Model, Sachse, TX (US)

(73) Assignee: Lineage Power Corporation, Plano, TX (US)

( * ) Notice: Subject to any disclaimer, the term of this patent is extended or adjusted under 35 U.S.C. 154(b) by 171 days.

(21) Appl. No.: 12/778,563

(22) Filed: May 12, 2010

(65) Prior Publication Data

US 2010/0289576 A1    Nov. 18, 2010

Related U.S. Application Data

(60) Provisional application No. 61/178,050, filed on May 14, 2009.

(51) Int. Cl.
*H03F 3/04* (2006.01)
(52) U.S. Cl. ............... 330/297; 323/268; 323/350
(58) Field of Classification Search .......... 330/297; 323/268, 350
See application file for complete search history.

(56) References Cited

U.S. PATENT DOCUMENTS

| 5,945,941 | A  | * | 8/1999  | Rich et al. ............... 342/157 |
| 6,529,073 | B1 | * | 3/2003  | Highfill et al. ............ 330/207 P |
| 6,774,612 | B1 | * | 8/2004  | Ballenger et al. .......... 323/303 |
| 7,403,400 | B2 | * | 7/2008  | Stanley .......................... 363/16 |
| 7,432,692 | B2 |   | 10/2008 | Wang et al. |
| 7,730,332 | B1 | * | 6/2010  | Templeton ................ 713/300 |
| 7,847,528 | B2 | * | 12/2010 | Li et al. ....................... 323/267 |

* cited by examiner

*Primary Examiner* — Patricia Nguyen

(57) ABSTRACT

A distributed power converter is for use with an RF power amplifier and includes a primary converter connected to an input voltage and configured to provide a regulated DC intermediate voltage that is galvanically isolated from the input voltage. Additionally, the distributed power converter also includes a secondary regulator connected galvanically to the regulated DC intermediate voltage and configured to generate a regulated DC supply voltage for at least a portion of the RF power amplifier. In another aspect, a method of operating a distributed power converter is for use with an RF power amplifier and includes providing a regulated DC intermediate voltage that is galvanically isolated from an input voltage and generating a regulated DC supply voltage for at least a portion of the RF power amplifier that is galvanically connected to the regulated DC intermediate voltage.

18 Claims, 5 Drawing Sheets

HIGH EFFICIENCY POWER AMPLIFIER POWER ARCHITECTURE

CROSS-REFERENCE TO PROVISIONAL APPLICATION

This application claims the benefit of U.S. Provisional Application No. 61/178,050, filed by Michael J. Model, on May 14, 2009, entitled "High Efficiency Power Amplifier Power Architecture" commonly assigned with this application and incorporated herein by reference.

TECHNICAL FIELD

The present disclosure is directed, in general, to power conversion and, more specifically, to a distributed power converter and a method of operating a distributed power converter.

BACKGROUND

Power converters are used in many important current applications. In cell phone applications, for example, a single direct current to direct current (DC/DC) converter may provide a DC supply voltage to a plurality of separate radio frequency (RF) power amplifiers associated with transmission from a base station to user equipment. This common source of DC supply voltage is shared between the plurality of RF power amplifiers employing a common ground connection. Each of the plurality of RF power amplifiers often provides different power gains as a function of different values of DC supply voltage. The common DC supply voltage is typically adjusted to accommodate the capability of the weakest RF power amplifier. This action requires a variation in required input signals to each RF power amplifier to avoid transmission power losses. Additionally, the voltage transient response associated with multiple scattered capacitances is often more sluggish than desired. Therefore, improvements in this area would prove beneficial to the art.

SUMMARY

Embodiments of the present disclosure provide a distributed power converter and a method of operating a distributed power converter. In one embodiment, the distributed power converter is for use with an RF power amplifier and includes a primary converter connected to an input voltage and configured to provide a regulated DC intermediate voltage that is galvanically isolated from the input voltage. Additionally, the distributed power converter also includes a secondary regulator connected galvanically to the regulated DC intermediate voltage and configured to generate a regulated DC supply voltage for at least a portion of the RF power amplifier.

In another aspect, the method of operating a distributed power converter is for use with an RF power amplifier and includes providing a regulated DC intermediate voltage that is galvanically isolated from an input voltage and generating a regulated DC supply voltage for at least a portion of the RF power amplifier that is galvanically connected to the regulated DC intermediate voltage.

The foregoing has outlined preferred and alternative features of the present disclosure so that those skilled in the art may better understand the detailed description of the disclosure that follows. Additional features of the disclosure will be described hereinafter that form the subject of the claims of the disclosure. Those skilled in the art will appreciate that they can readily use the disclosed conception and specific embodiment as a basis for designing or modifying other structures for carrying out the same purposes of the present disclosure.

BRIEF DESCRIPTION OF THE DRAWINGS

For a more complete understanding of the present disclosure, reference is now made to the following descriptions taken in conjunction with the accompanying drawings, in which.

DETAILED DESCRIPTION

Wireless base station RF power amplifier assemblies, using a single voltage source to power multiple RF final amplifier stages, suffer from inefficiency due to the inability to individually control a static DC voltage level provided to each RF amplifier and a dynamic change in this DC voltage level to allow for envelope tracking.

Gain of RF final power amplifier transistors may vary significantly due to several factors including manufacturing variations and local ambient temperature. The DC voltage source for the RF amplifier may be adjusted to allow a given final stage to deliver an intended RF output power with a required linearity. A single source of DC supply voltage is required to be high enough to allow the RF final amplifier stage with the weakest gain to deliver its intended RF output power and linearity. This requirement typically causes the DC voltage level on other RF power amplifier stages to be excessively high, leading to more losses and inefficiency.

Migration to a digital wireless standard has caused increased peak to average power ratios in RF final stages. The voltage supply to the final power amplifier stage is required to be high enough to support its peak power requirement. However, for most of the time, the RF power level is much lower, and the RF final stage experiences high losses due to an excessively high voltage supply. A single isolated power converter may not be dynamically adjustable to lower voltages unless all RF final stages are operating at their lower power conditions. Additionally, isolated power converters are typically not transiently responsive enough to accurately track a desired output envelope of an RF final stage.

Embodiments of the present disclosure provide DC power to the RF power amplifier or its various stages using a fixed duty cycle isolated DC/DC converter that is followed by one or more DC/DC regulators. Multiple final RF voltage levels may be generated that provide independent supply voltage setting and control to allow individual RF power amplifier efficiency enhancements. This leads to improvements in RF power amplifier cost and physical volume considerations, as well.

Figure 1:
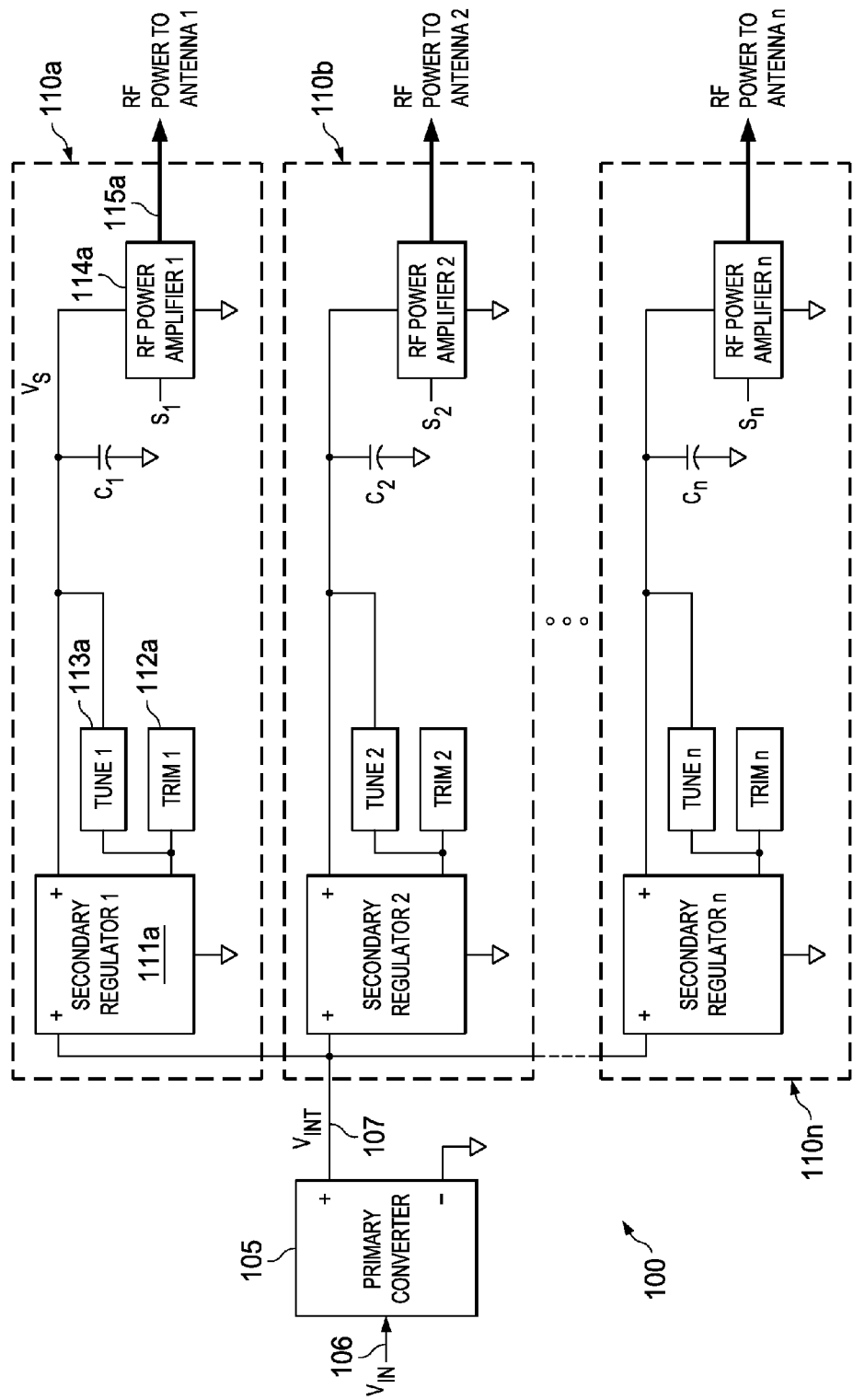
FIG. 1 illustrates a diagram of an embodiment of a distributed power converter for use with a plurality of RF power amplifiers constructed according to the principles of the present disclosure.

FIG. 1 illustrates a diagram of an embodiment of a distributed power converter for use with a plurality of RF power amplifiers, generally designated 100, constructed according to the principles of the present disclosure. In the illustrated embodiment, the distributed power converter 100 may be employed in a cellular base station and includes a primary converter 105, and a plurality of secondary regulator units 110a-110n wherein a secondary regulator unit 110a is typical. The secondary regulator unit 110a includes a secondary regulator 111a, a trim module 112a, a tune module 113a, a filter capacitor $C_1$ and an RF power amplifier 114a having an input $S_1$ and an RF output 115a.

The primary converter 105 employs an input 106 that is connected to an input voltage $V_{IN}$ and an output 107 that provides a regulated DC intermediate voltage $V_{INT}$ galvanically isolated from the input voltage $V_{IN}$. The secondary regulator 111a is connected galvanically to the regulated DC intermediate voltage $V_{INT}$ and generates a regulated DC supply voltage $V_{sup}$ for at least a portion of the RF power amplifier 114a. In an alternative embodiment, the portion of the RF power amplifier 114a may be a final RF amplifier stage of the RF power amplifier 114a.

The input DC voltage $V_{IN}$ from a base station mains or battery source is received at the primary converter 105, which provides protection from source disturbances and galvanically isolates the input source from the plurality of secondary regulator units 110a-110n receiving the regulated DC intermediate voltage $V_{INT}$. The primary converter 105 operates at a fixed duty cycle of about 50 percent to continuously transfer power from its input to its output and achieve a very high efficiency.

The regulated DC intermediate voltage $V_{INT}$ from the primary converter 105 is approximately equal to the input voltage $V_{IN}$ when the source is in a range of about 36VDC-72VDC, as is typical for nominal 48VDC wireless base stations. The regulated DC intermediate voltage $V_{INT}$ is approximately doubled when the source is a range of about 18VDC-36VDC, as is typical for nominal 24VDC wireless base stations. Use of a higher output voltage value allows for diode rectification and is necessary for step down load converters to provide 16V to 32V outputs used by the RF power amplifier 114a. Changes in the input DC voltage $V_{IN}$ causes a relatively equal change to the regulated DC intermediate voltage $V_{INT}$.

The regulated DC intermediate voltage $V_{INT}$ is delivered to the secondary regulator 111a, which is a non-isolated buck regulator in this embodiment. The secondary regulator 111a provides a steady, regulated DC supply voltage $V_S$ during changes to the input voltage $V_{IN}$. A value of the regulated DC supply voltage $V_S$ from the secondary regulator 111a may be individually adjusted employing the trim module 112a to meet the individual requirements of the RF power amplifier 114a.

The trim module 112a provides a variable duty cycle for the secondary regulator 111a and a corresponding variation in the value of the regulated DC supply voltage $V_S$. This action provides for a more optimum efficiency and gain variation linearity of the RF power amplifier 114a. The trim module 112a also provides a reduced value of the regulated DC supply voltage $V_s$ during an idle time of at least the portion of the RF power amplifier 114a to which it is applied, thereby allowing for greater overall efficiency.

Additionally, the transient response may be optimized via the tune module 113a corresponding to different values of the filter capacitor $C_1$ thereby providing voltage transient control for the RF power amplifier 114a. Examples of such a transient response circuit are described in U.S. Pat. No. 7,432,692 B2 titled "Circuit and Method for Changing Transient Response Characteristics of a DC/DC Converter Module" by Thomas G. Wang, Vijayan J. Thottuvelil and Cahit Gezgin issued on Oct. 7, 2008, which is incorporated by reference herein in its entirety.

Figure 2:
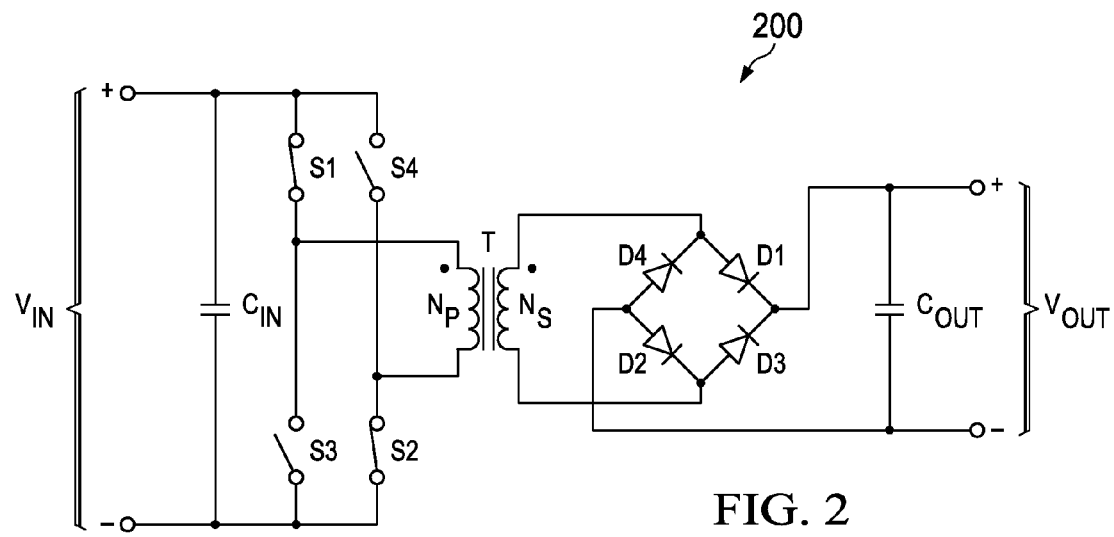
FIG. 2 illustrates a schematic of an example of an isolated power converter as may be employed as a primary converter in the distributed power converter of FIG. 1.

FIG. 2 illustrates a schematic of an example of an isolated power converter, generally designated 200, as may be employed as a primary converter in the distributed power converter 100 of FIG. 1. The isolated power converter 200 includes an input capacitor $C_{IN}$, first and second pairs of switches S1, S2 and S3, S4, an isolation transformer T having primary and secondary windings $N_P$, $N_S$, a bridge rectifier consisting of diodes D1, D2, D3, D4 and an output capacitor $C_{OUT}$. The isolated power converter 200 receives a DC input voltage $V_{IN}$ and provides a regulated DC output voltage $V_{OUT}$, which may be employed as the regulated DC intermediate voltage $V_{INT}$ discussed with respect to FIG. 1.

The input voltage $V_{IN}$ is applied to the primary winding $N_P$ of the isolation transformer T via first and second pairs of switches S1, S2 and S3, S4 operating alternatively with about a percent fixed duty cycle. This produces an alternating current (AC) waveform across the isolation transformer T having a peak value of about twice the input DC voltage $V_{IN}$. If a turns ratio of the isolation transformer T is 1:1, the secondary winding $N_S$ delivers an AC waveform of twice the input voltage $V_{IN}$ (at a 50 percent duty cycle), which is then rectified by the bridge rectifier to an amplitude of the DC output voltage $V_{OUT}$ equal to the input voltage $V_{IN}$. If the turns ratio is 2:1, the secondary AC voltage is four times the input voltage $V_{IN}$ (for a 50% duty cycle), which provides an amplitude of the DC output voltage $V_{OUT}$ equal to twice the input voltage $V_{IN}$.

Figure 3:
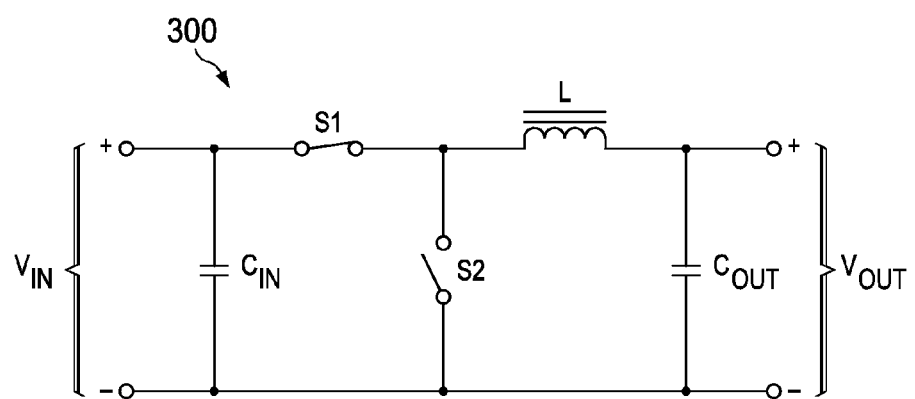
FIG. 3 illustrates a schematic of a non-isolated regulator as may be employed as a secondary regulator in the distributed power converter of FIG. 1.

FIG. 3 illustrates a schematic of a non-isolated regulator, generally designated 300, as may be employed as a secondary regulator in the distributed power converter 100 of FIG. 1. The non-isolated regulator 300 includes an input capacitor $C_{IN}$, first and second switches S1, S2, an inductor L and an output capacitor $C_{our}$. The non-isolated regulator 300 receives a DC input voltage $V_{IN}$ and provides a DC output voltage $V_{OUT}$, which corresponds to the regulated DC supply voltage $V_s$ as discussed with respect to FIG. 1.

The DC input voltage $V_{IN}$ is applied to the inductor L through the first switch S1 with a duty cycle of D. When the first switch S1 is closed, the DC input voltage $V_{IN}$ causes current to increase in the inductor L proportional to its inductance value and the amplitude of the DC input voltage $V_{IN}$. The second switch S2 operates with a duty cycle of 1-D and out of phase with the first switch S1. That is, when the first switch S1 opens, the second switch S2 closes. This ensures that the inductor L always has a path for current flow.

When the first switch S1 is closed, current through the inductor L is increasing proportional to values of the output capacitor $C_{OUT}$ and a load across the DC output voltage $V_{OUT}$ (not shown in FIG. 3). When the second switch S2 is closed, current through the inductor L is decreasing proportional to the values of the load and the output capacitor $C_{OUT}$. The relationship between the DC input voltage $V_{IN}$ and the DC output voltage $V_{OUT}$ may be expressed by $V_{OUT}=DV_{IN}$, where D is the duty cycle of the first switch S1. The value of D is adjusted to provide a required value of the DC output voltage $V_{OUT}$. Absence of a coupling transformer allows the non-isolated regulator 300 to provide an improved transient response to required changes in its DC output voltage $V_{OUT}$ compared to employing transformer coupling such as the isolated power converter 200 of FIG. 1.

Figure 4:
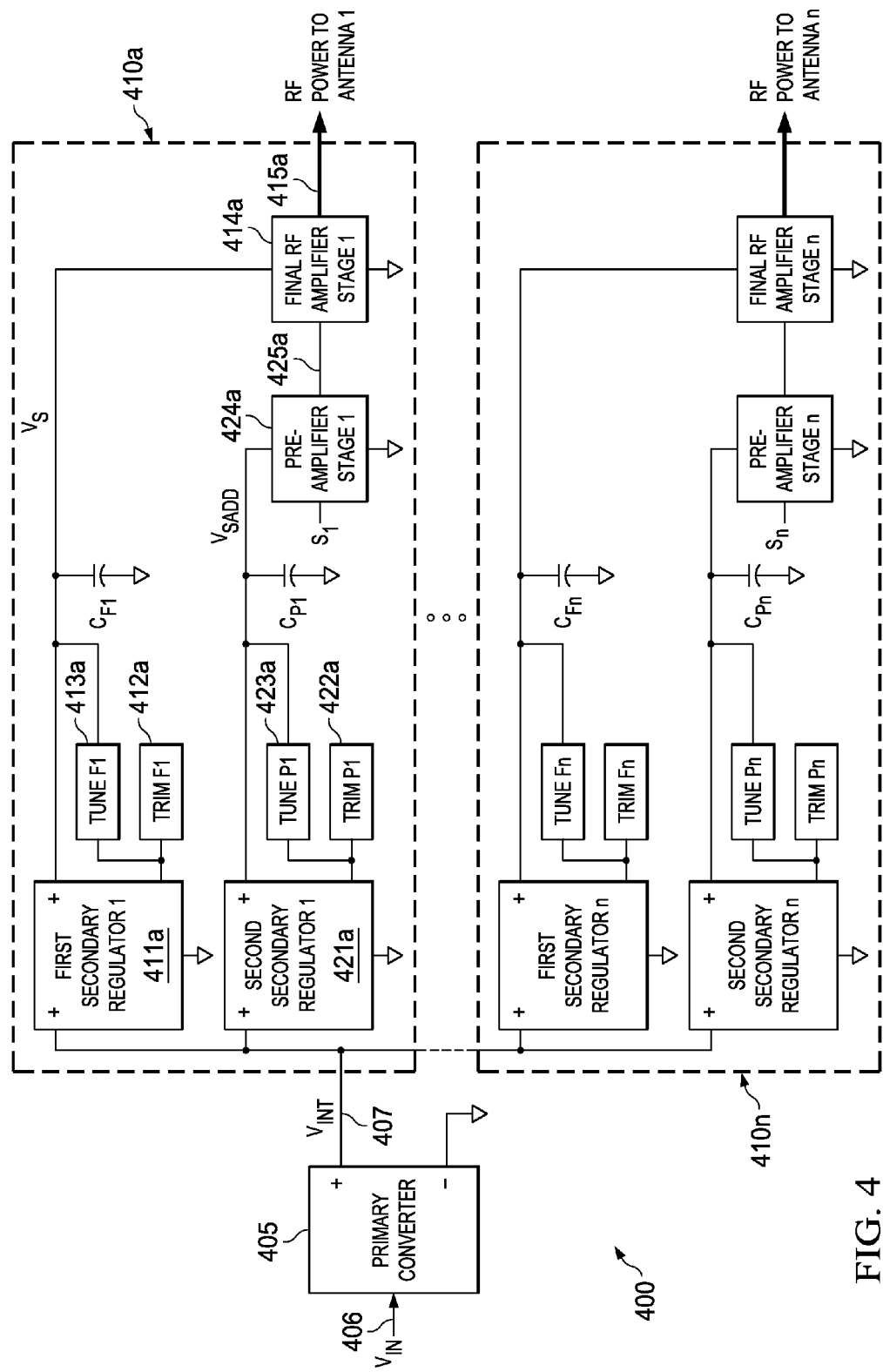
FIG. 4 illustrates a diagram of an additional embodiment of a distributed power converter for use with a plurality of RF power amplifiers constructed according to the principles of the present disclosure.

FIG. 4 illustrates a diagram of an additional embodiment of a distributed power converter for use with a plurality of RF power amplifiers, generally designated 400, constructed according to the principles of the present disclosure. The distributed power converter 400 may also be employed in a cellular base station and includes a primary converter 405, and a plurality of secondary regulator units 410a-410n wherein a secondary regulator unit 410a is typical. The primary converter 405 employs an input 406 that is connected to an input voltage $V_{IN}$ and an output 407 that provides a regulated DC intermediate voltage $V_{INT}$ galvanically isolated from the input voltage $V_{IN}$.

The secondary regulator unit 410a includes a first secondary regulator 411a employing a trim module 412a and a tune module 413a as before, a filter capacitor $C_{F1}$ and a final RF amplifier stage 414a having an RF output 415a. The first secondary regulator 411a is connected galvanically to the regulated DC intermediate voltage $V_{INT}$ and generates a first regulated DC supply voltage $V_s$ for the final RF amplifier stage 414a.

The secondary regulator unit 410a also includes a second secondary regulator 421a employing a trim module 422a and a tune module 423a, a filter capacitor $C_{P1}$ and a preamplifier stage 424a having an input S1 and a preamplifier output 425a connected to the final RF amplifier stage 414a. In the illustrated embodiment, the preamplifier stage 424a may be an RF preamplifier stage or an intermediate frequency (IF) preamplifier stage. The second secondary regulator 421a is connected galvanically to the regulated DC intermediate voltage $V_{INT}$ and generates a second regulated DC supply voltage $V_{SADD}$ for the preamplifier stage 424a.

General operation of the distributed power converter 400 reflects that discussed with respect to the FIGS. 1, 2 and 3 above. However, the distributed power converter 400 provides the second regulated DC supply voltage $V_{SADD}$ that may be modified independently of the first regulated DC supply voltage $V_S$.

Figure 5:
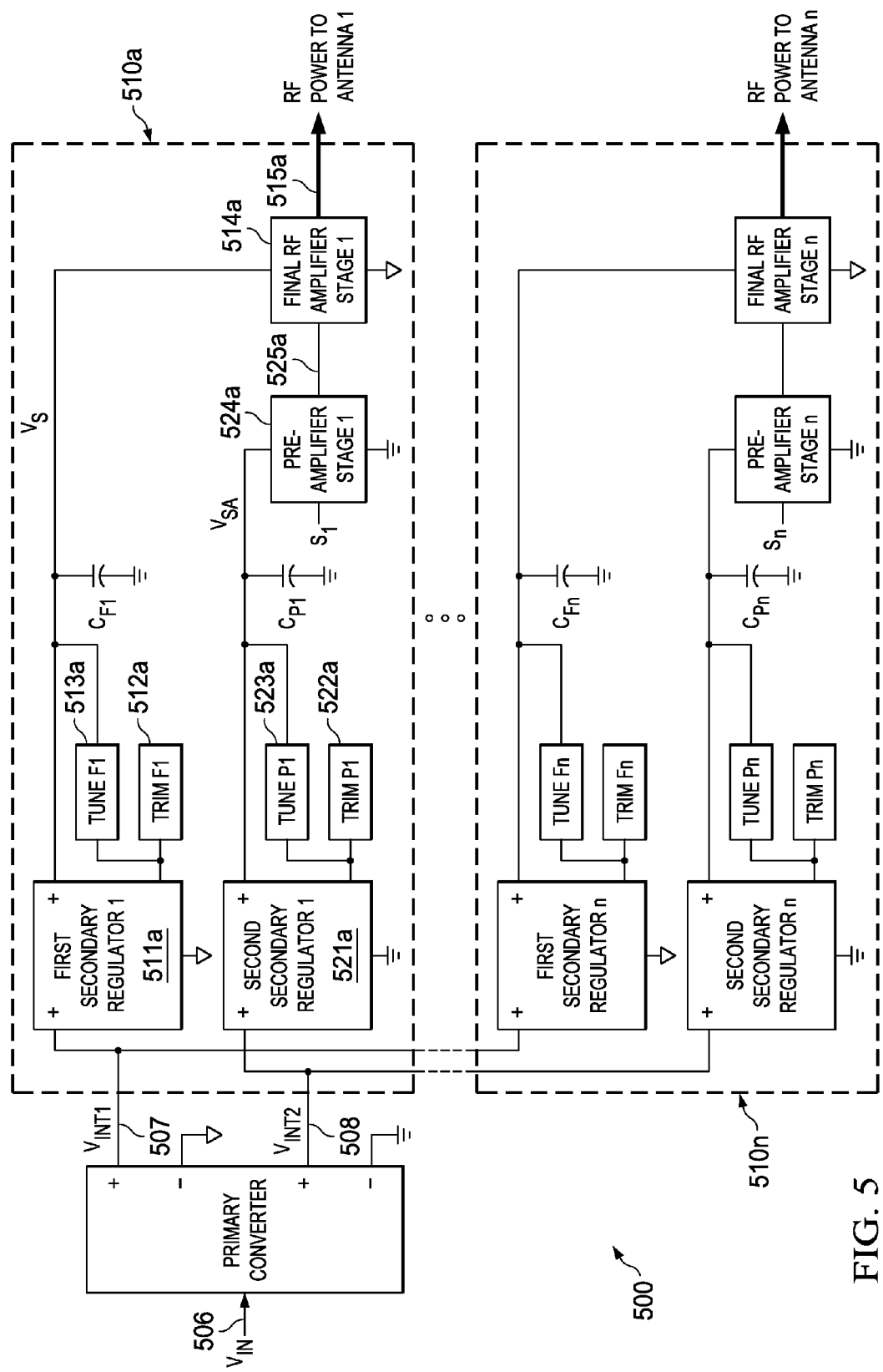
FIG. 5 illustrates a diagram of another embodiment of a distributed power converter for use with a plurality of RF power amplifiers constructed according to the principles of the present disclosure.

FIG. 5 illustrates a diagram of another embodiment of a distributed power converter for use with a plurality of RF power amplifiers, generally designated 500, constructed according to the principles of the present disclosure. The distributed power converter 500 may also be employed in a cellular base station and includes a primary converter 505, and a plurality of secondary regulator units 510a-510n wherein a secondary regulator unit 510a is typical. The primary converter 505 employs an input 506 that is connected to an input voltage $V_{IN}$ and first and second outputs 507, 508 that correspondingly provide first and second regulated DC intermediate voltages $V_{INT1}$, $V_{INT2}$ galvanically isolated from the input voltage $V_{IN}$ and from each other.

The secondary regulator unit 510a includes a first secondary regulator 511a employing a trim module 512a and a tune module 513a as before, a filter capacitor $C_{F1}$ and a final RF amplifier stage 514a having an RF output 515a. The first secondary regulator 511a is connected galvanically to the first regulated DC intermediate voltage $V_{INT1}$ and generates a first regulated DC supply voltage $V_S$ for the final RF amplifier stage 514a.

The secondary regulator unit 510a also includes a second secondary regulator 521a employing a trim module 522a and a tune module 523a, a filter capacitor $C_{P1}$ and a preamplifier stage 524a having an input S1 and a preamplifier output 525a connected to the final RF amplifier stage 514a. In the illustrated embodiment, the preamplifier stage 524a may be an RF preamplifier stage or an intermediate frequency (IF) preamplifier stage, as before. The second secondary regulator 521a is connected galvanically to the second regulated DC intermediate voltage $V_{INT2}$ and generates a second regulated DC supply voltage $V_{SA}$ for the preamplifier stage 524a. This second regulated DC supply voltage $V_{SA}$ is galvanically isolated from both the input voltage $V_{IN}$ and the first regulated DC supply voltage $V_S$ as may be advantageously required in some applications.

General operation of the distributed power converter 500 reflects that discussed with respect to the FIGS. 1, 2 and 3. However, the isolated power converter 200 requires another transformer secondary winding feeding a second output circuit to provide the second regulated DC intermediate voltage $V_{INT2}$ for the second secondary regulator 521a and generate the second regulated DC supply voltage $V_{SA}$ that is isolated.

Figure 6:
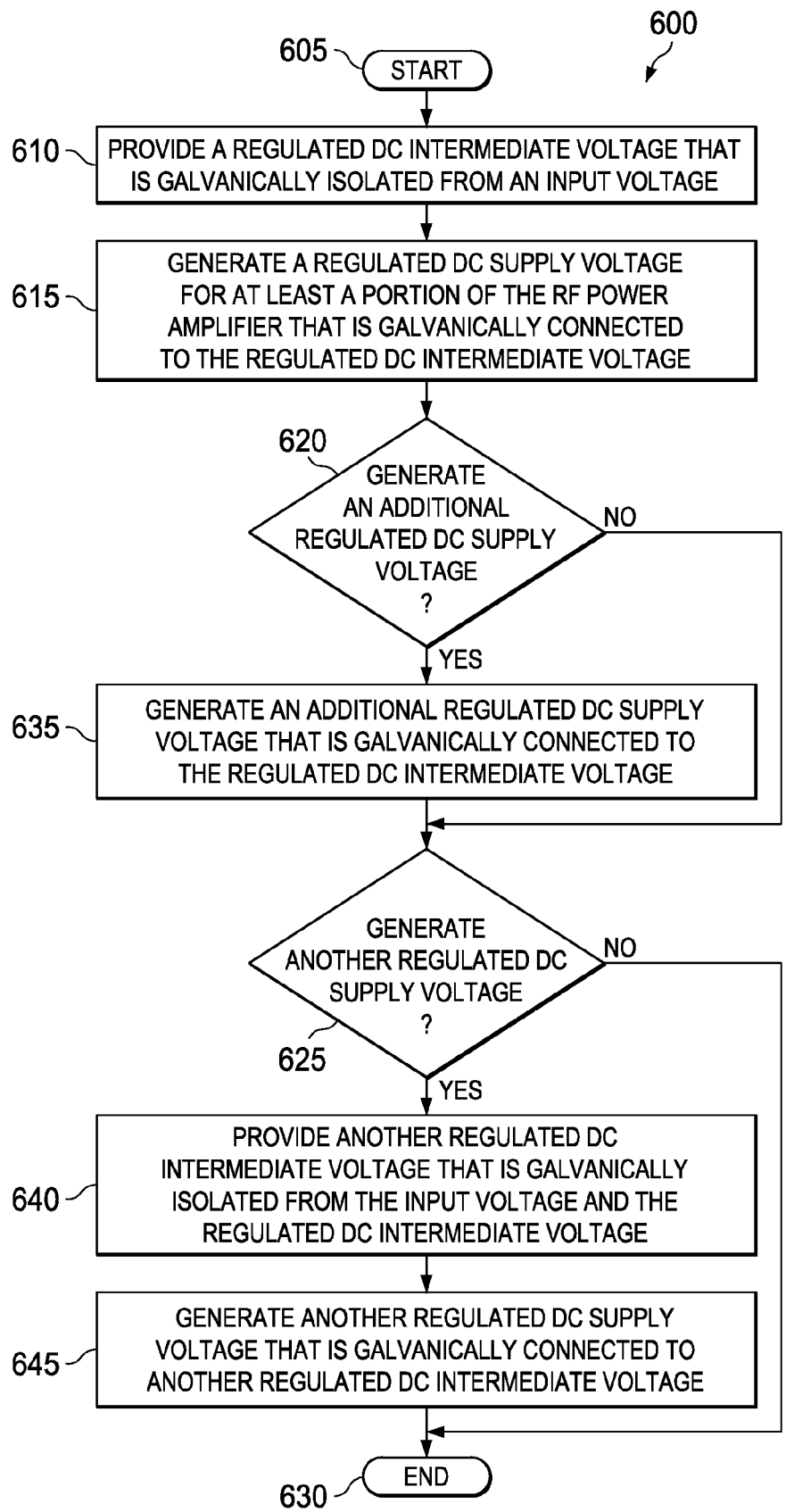
FIG. 6 illustrates a flow diagram of an embodiment of a method of operating a power converter carried out in accordance with the principles of the present disclosure.

FIG. 6 illustrates a flow diagram of an embodiment of a method of operating a power converter, generally designated 600, carried out in accordance with the principles of the present disclosure. The method 600 is for use with an RF power amplifier and starts in a step 605. Then, in a step 610, a regulated DC intermediate voltage that is galvanically isolated from an input voltage is provided. The regulated DC intermediate voltage is provided through a fixed duty cycle conversion.

A regulated DC supply voltage for at least a portion of the RF power amplifier is generated that is galvanically connected to the regulated DC intermediate voltage, in a step 615. The regulated DC supply voltage is generated through a variable duty cycle regulation process wherein a reduced value of the regulated DC supply voltage may be generated during an idle time of at least the portion of the RF power amplifier, which may include a final RF amplifier stage.

A first decisional step 620 determines if an additional non-isolated DC regulated supply voltage is to be generated. If the additional non-isolated DC regulated supply voltage is not to be generated, the method 600 proceeds to a second decisional step 625 which determines if another isolated regulated DC supply voltage is to be generated. If another isolated regulated DC supply voltage is not to be generated the method 600 ends in a step 630.

If the first decisional 620 determines that an additional non-isolated DC regulated supply voltage is to be generated, the method 600 proceeds to a step 635. In the step 635, the additional non-isolated regulated DC supply voltage is generated that is galvanically connected to the regulated DC intermediate voltage. The method 600 then proceeds to the second decisional step 625 which determines if another isolated regulated DC supply voltage is to be generated. If again, another isolated regulated DC supply voltage is not to be generated the method 600 ends in a step 630.

If the second decisional step 625 determines that another isolated regulated DC supply voltage is to be generated, the method 600 proceeds to a step 640. In the step 640, another isolated regulated DC intermediate voltage is provided that is galvanically isolated from the input voltage and the regulated DC intermediate voltage. Then, in a step 645, another isolated and regulated DC supply voltage is generated that is galvanically connected to the another isolated and regulated DC intermediate voltage. Both the additional non-isolated regulated DC supply voltage and the another isolated regulated DC supply voltage may be generated for a preamplifier stage of the RF power amplifier. The method again ends in the step 630.

While the method disclosed herein has been described and shown with reference to particular steps performed in a particular order, it will be understood that these steps may be combined, subdivided, or reordered to form an equivalent method without departing from the teachings of the present disclosure. Accordingly, unless specifically indicated herein, the order or the grouping of the steps are not limitations of the present disclosure.

Those skilled in the art to which the disclosure relates will appreciate that other and further additions, deletions, substitutions and modifications may be made to the described example embodiments without departing from the disclosure.

What is claimed is:

1. A distributed power converter for use with an RF power amplifier, comprising:
   a primary converter connected to an input voltage and configured to provide a regulated DC intermediate voltage that is galvanically isolated from the input voltage, wherein the secondary regulator is a variable duty cycle regulator; and
   a secondary regulator connected galvanically to the regulated DC intermediate voltage and configured to generate a regulated DC supply voltage for at least a portion of the RF power amplifier.

2. The converter as recited in claim 1 wherein the secondary regulator provides a reduced value of the regulated DC supply voltage during an idle time of at least the portion of the RF power amplifier.

3. The converter as recited in claim 1 wherein the secondary regulator generates the regulated DC supply voltage for a final RF amplifier stage of the RF power amplifier.

4. The converter as recited in claim 1 further comprising an additional secondary regulator connected galvanically to the regulated DC intermediate voltage and configured to generate an additional regulated DC supply voltage.

5. The converter as recited in claim 4 wherein the additional secondary regulator provides the additional regulated DC supply voltage to a preamplifier stage of the RF power amplifier.

6. The converter as recited in claim 1 further comprising the primary converter configured to provide another regulated DC intermediate voltage that is galvanically isolated from the input voltage and the regulated DC intermediate voltage.

7. The converter as recited in claim 6 further comprising another secondary regulator connected galvanically to the another regulated DC intermediate voltage and configured to generate another regulated DC supply voltage.

8. The converter as recited in claim 7 wherein the another secondary regulator generates the another regulated DC supply voltage for a preamplifier of the RF power amplifier.

9. A method of operating a distributed power converter for use with an RF power amplifier, comprising:
   providing a regulated DC intermediate voltage that is galvanically isolated from an input voltage; and
   generating a regulated DC supply voltage, employing a variable duty cycle regulation, for at least a portion of the RF power amplifier that is galvanically connected to the regulated DC intermediate voltage.

10. The method as recited in claim 9 wherein generating the regulated DC supply voltage includes generating a reduced value of the regulated DC supply voltage during an idle time of at least the portion of the RF power amplifier.

11. The method as recited in claim 9 wherein generating the regulated DC supply voltage includes generating the regulated DC supply voltage for a final RF amplifier stage of the RF power amplifier.

12. The method as recited in claim 9 wherein generating the regulated DC supply voltage further comprises generating an additional regulated DC supply voltage that is galvanically connected to the regulated DC intermediate voltage.

13. The method as recited in claim 12 wherein the additional regulated DC supply voltage is generated for a preamplifier stage of the RF power amplifier.

14. The method as recited in claim 9 wherein providing the regulated DC intermediate voltage further comprises providing another regulated DC intermediate voltage that is galvanically isolated from the input voltage and the regulated DC intermediate voltage.

15. The method as recited in claim 14 wherein generating the regulated DC supply voltage further comprises generating another regulated DC supply voltage that is galvanically connected to the another regulated DC intermediate voltage.

16. The method as recited in claim 15 wherein the another regulated DC supply voltage is generated for a preamplifier stage of the RF power amplifier.

17. A distributed power converter for use with an RF power amplifier, comprising:
   a primary converter, connected to an input voltage, configured to provide a regulated DC intermediate voltage that is galvanically isolated from the input voltage and configured to provide another regulated DC intermediate voltage that is galvanically isolated from the input voltage and the regulated DC intermediate voltage; and
   a secondary regulator connected galvanically to the regulated DC intermediate voltage and configured to generate a regulated DC supply voltage for at least a portion of the RF power amplifier.

18. A distributed power converter for use with an RF power amplifier, comprising:
   a primary converter connected to an input voltage and configured to provide a regulated DC intermediate voltage that is galvanically isolated from the input voltage;
   a secondary regulator connected galvanically to the regulated DC intermediate voltage and configured to generate a regulated DC supply voltage for at least a portion of the RF power amplifier; and
   an additional secondary regulator connected galvanically to the regulated DC intermediate voltage and configured to generate an additional regulated DC supply voltage, wherein the additional secondary regulator provides the additional regulated DC supply voltage to a preamplifier stage of the RF power amplifier.

* * * * *

UNITED STATES PATENT AND TRADEMARK OFFICE
CERTIFICATE OF CORRECTION

| | | |
|---|---|---|
| PATENT NO. | : 8,193,864 B2 | Page 1 of 1 |
| APPLICATION NO. | : 12/778563 | |
| DATED | : June 5, 2012 | |
| INVENTOR(S) | : Model | |

It is certified that error appears in the above-identified patent and that said Letters Patent is hereby corrected as shown below:

In the Specification

In Column 4, Line 26, delete "a percent" and insert -- a 50 percent --, therefor.

Signed and Sealed this
Eighth Day of July, 2014

Michelle K. Lee
*Deputy Director of the United States Patent and Trademark Office*